(12) United States Patent
Ushikoshi et al.

(10) Patent No.: US 7,965,568 B2
(45) Date of Patent: Jun. 21, 2011

(54) SEMICONDUCTOR INTEGRATED CIRCUIT DEVICE AND METHOD OF TESTING SAME

(75) Inventors: Kenichi Ushikoshi, Kanagawa (JP);
Nobutoshi Tsunesada, Kanagawa (JP);
Tsuyoshi Hirakawa, Kanagawa (JP);
Noriaki Komatsu, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 345 days.

(21) Appl. No.: 12/350,546

(22) Filed: Jan. 8, 2009

(65) Prior Publication Data

US 2009/0190417 A1    Jul. 30, 2009

(30) Foreign Application Priority Data

Jan. 25, 2008  (JP) ................... 2008-014982

(51) Int. Cl.
*G11C 7/00*  (2006.01)
(52) U.S. Cl. ..................... 365/201; 714/730
(58) Field of Classification Search .................. 365/201; 714/730
See application file for complete search history.

(56) References Cited

U.S. PATENT DOCUMENTS

2005/0289428 A1   12/2005  Ong
2006/0026475 A1*  2/2006  Arnold et al. ............. 714/730

FOREIGN PATENT DOCUMENTS

JP   2004-158098   6/2004

* cited by examiner

*Primary Examiner* — Hoai V Ho
*Assistant Examiner* — Anthan T Tran
(74) *Attorney, Agent, or Firm* — Young & Thompson (57) ABSTRACT

A semiconductor integrated circuit device includes a first chip that is directly accessible from outside, a second chip that transmits and receives data to and from the first chip, the second chip being not directly accessible from outside, and a through circuit that is provided in the first chip and transmits first and second test signals input from an external device to the second chip, wherein the through circuit includes a first signal transmission path to generate a first signal by synchronizing the first test signal to a clock signal input from the external device and to output it to the second chip and a second signal transmission path to generate a second signal by synchronizing the second test signal to a test clock signal input from the external device and to output it to the second chip.

16 Claims, 7 Drawing Sheets

SEMICONDUCTOR INTEGRATED CIRCUIT DEVICE AND METHOD OF TESTING SAME

BACKGROUND

1. Field of the Invention

The present invention relates to a semiconductor integrated circuit device and a method of testing the same, in particular a semiconductor integrated circuit device having a first chip that is externally accessible and a second chip that cannot be accessed directly from the outside, and a method of testing the same.

2. Description of Related Art

A semiconductor integrated circuit device capable of achieving a large-scale system in a single package by adopting a SiP (System in Package) architecture in which plural chips having different functions such as a memory chip and a logic chip are mixed and mounted in the single package has been proposed. It has been desired to reduce package size and the number of input/output terminals in such semiconductor integrated circuit devices having the SiP architecture. To answer such requirements, a structure has been adopted in which no external terminals are provided for a chip that need not be externally accessed as the semiconductor integrated circuit device functions as a finished product.

However, when a semiconductor integrated circuit device contains a chip in such a manner where no external terminal is provided for the chip, it becomes very difficult to carry out a test on that chip after the package is assembled. Accordingly, a through circuit or the like is provided in another chip that can be directly accessed from the outside as an access path to the chip for which no external terminal is provided.

Figure 7:
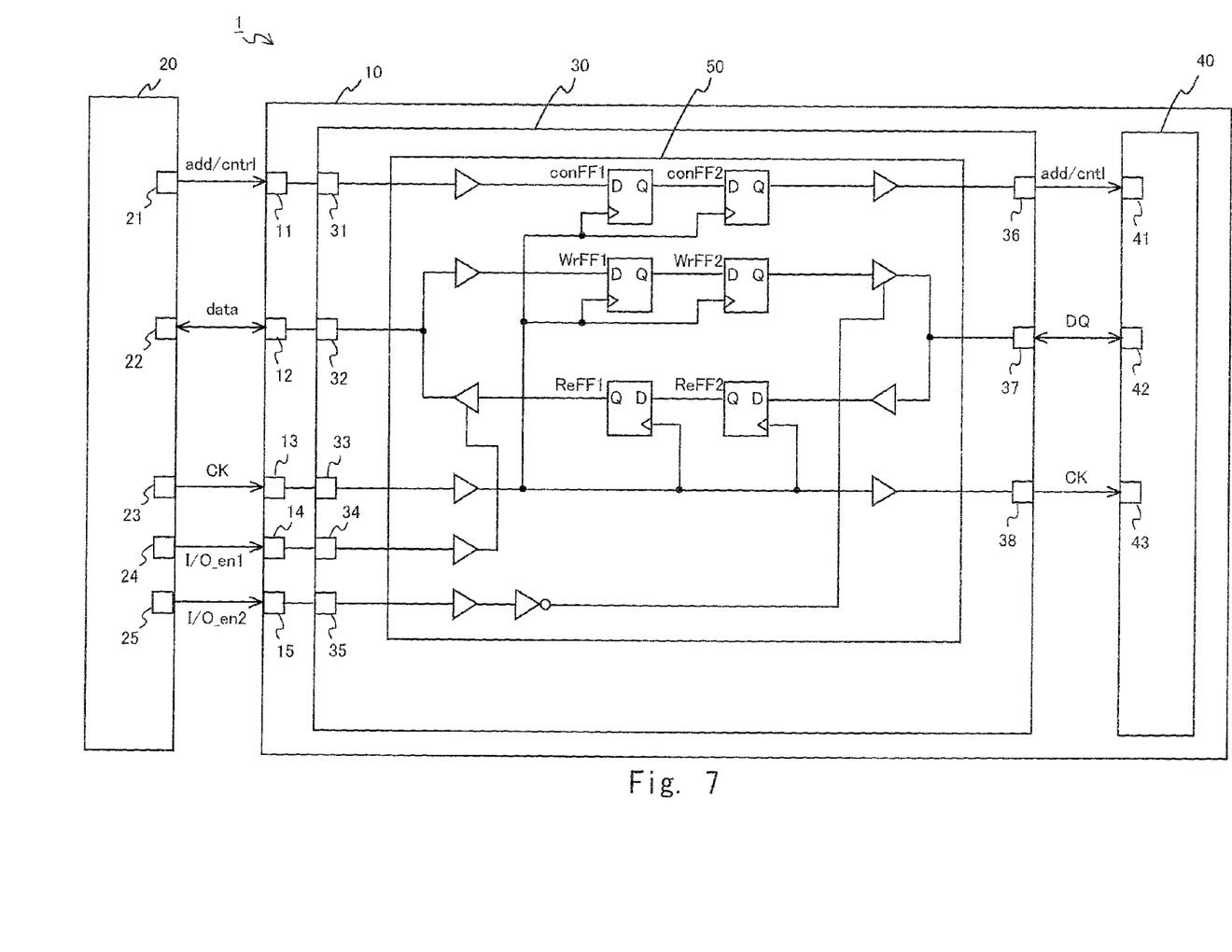
FIG. 7 is a structural diagram of a semiconductor integrated circuit device in the related art.

FIG. 7 shows a structural block diagram of a semiconductor integrated circuit device 1 and its connection relationship with a tester 20 that carries out a test on a memory chip contained in the semiconductor integrated circuit device 1 in the related art. As shown in FIG. 7, the semiconductor integrated circuit device 1 in the related art includes a logic chip 30 and a SDR (Single Data Rate) memory chip 40, both of which are mounted in a single package 10. Note that the logic chip 30 corresponds to the chip that can be directly accessed from the outside, and the memory chip 40 corresponds to the chip that cannot be directly accessed from the outside.

In general, it is very difficult to test a memory chip through the logic terminals in a SIP in which the external terminals do not include any terminal dedicated to the memory chip as in the case of the above-described package 10. Therefore, a through circuit 50 for a test is provided in the logic chip 30 so that a memory test can be carried out by accessing to the SDR memory chip 40 through that through circuit.

The through circuit 50 includes flip-flops conFF1 and conFF2 for address and control signals ("add/conr1" in FIG. 7) flip-flops WrFF1 and WrFF2 for write data, flip-flops ReFF1 and ReFF2 for read data, and various buffers. As can be seen from FIG. 7, the SDR memory chip 40 is not directly connected to any external terminals of the package 10, and access to the SDR memory chip 40 are entirely carried out through the through circuit 50.

A terminal 21 for address/control signals of a tester 20, a terminal 22 for data, a control clock terminal 23, a bus control signal terminals 24 and 25 for write data are connected to terminals 11-15 of the package 10. Furthermore, the terminals 11-15 are connected to terminals 31-35 of the logic chip 30. Signals output from the tester 20 pass through the through circuit 50 and are output from terminals 36-38 of the logic chip 30, and then input to a terminal 41 for address and control signals, a terminal 42 for data, and a control clock terminal 43 of the SDR memory chip 40. Meanwhile, output data signals from the data terminal 42 of the SDR memory chip 40 are input to the terminal 37 of the logic chip 30, and pass through the terminal 32 of the logic chip 30 and the terminal 12 of the package 10 and are input to the terminal 22 of the package 10.

When an operational test is carried out on the SDR memory chip 40 at high speed, the test is carried out in such a manner that all data signals and control signals are synchronized to a control clock CK through flip-flops (FFs) in the logic chip 30 as shown in FIG. 7. In the structure of this related-art example, one write data is input from the through circuit 50 to the SDR memory chip 40 for each clock of the control clock CK. Furthermore, one read data is output from the SDR memory chip 40 for each clock of the control clock CK.

Incidentally, DDR (Double Data Rate) memories, whose transfer rates are about twice as fast as those of SDR memories, have been increasingly used as memories in recent years. A DDR memory has an additional input/output terminal for a signal called "data strobe" in comparison with a SDR memory, and carries out data input/output in synchronization with the rising edge or the falling edge of this data strove signal. The input/output terminal for this data strove (DQS) signal is called a "DQS pin". The DQS signal, which is input from the DQS pin, is necessary to secure a set-up margin (tDS) and a hold margin (tDH) with respect to input data in write operation of a DDR memory.

Note that Japanese Unexamined Patent Application Publication No. 2004-158098 (Patent document 1) discloses a technique for a SiP-type semiconductor device using an SDR memory. Furthermore, U.S. Patent Application Publication No. 2005/0289428A1 (Patent document 2) discloses a technique for a SiP-type semiconductor device using a DDR memory.

SUMMARY

As stated above, the difference between the SDR memory specification and the DDR memory specification includes the presence or absence of support for the DQS pin. A data strobe signal to be input to this DQS pin needs to be input in such a manner that the tDS and tDH margins are secured with respect to input data in write operation of a DDR memory. However, all function terminals are operated in synchronization with the control clock CK in the SiP circuit structure shown in FIG. 7. Therefore, if a DDR memory is used in a SiP having such a circuit structure, all function terminals including the DQS pin to which a data strobe signal is input are operated in synchronization with the control clock CK. Consequently, it has been very difficult to secure set-up/hold margins in write operation of a DDR memory in a SiP using a DDR memory, making it impossible to carry out data write operation.

Similarly, Patent document 1 uses an SDR memory, thus causing a problem in terms of the support for a DQS pin.

Meanwhile, the invention of Patent document 2 generates an input address for the DDR memory within the SiP. Therefore, the DDR memory cannot be directly accessed from an external device such as a tester, thus causing a problem that testing flexibility is reduced.

A first exemplary aspect of an embodiment of the present invention is a semiconductor integrated circuit device including: a first chip that is directly accessible from outside; a second chip that transmits and receives data to and from the first chip, the second chip being not directly accessible from outside; and a through circuit that is provided in the first chip and transmits a first test signal and a second test signal to the second chip, the first and second test signals being input from an external device; wherein the through circuit includes: a first signal transmission path to generate a first signal by synchronizing the first test signal to a clock signal input from the external device and to output the first signal to the second chip; and a second signal transmission path to generate a second signal generated by synchronizing the second test signal to a test clock signal input from the external device and to output the second signal to the second chip.

Another exemplary aspect of an embodiment of the present invention is a method of testing a semiconductor integrated circuit device including a first chip and a second chip in a single package, the first chip being directly accessible from outside and the second chip being accessed from outside through the first chip, including: synchronizing a first test signal supplied from an external device to a clock signal supplied from the external device and supplying the synchronized first test signal to the second chip; and synchronizing a second test signal supplied from the external device to a test clock signal supplied from the external device and supplying the synchronized second test signal to the second chip.

A semiconductor integrated circuit device in accordance one aspect of the present invention can control signal transmission paths for signals that are output from the through circuit to the second chip separately with a clock signal and a test clock signal. Therefore, the synchronous relation between the first signal and the second signal, both of which are supplied to the second chip, can be freely established, and thus set-up/hold margins can be secured in signal transmission/reception at high speed.

The present invention enables a test using high-speed signals to be carried out on the second chip that cannot be directly accessed from the outside.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

First Exemplary Embodiment

Figure 1:
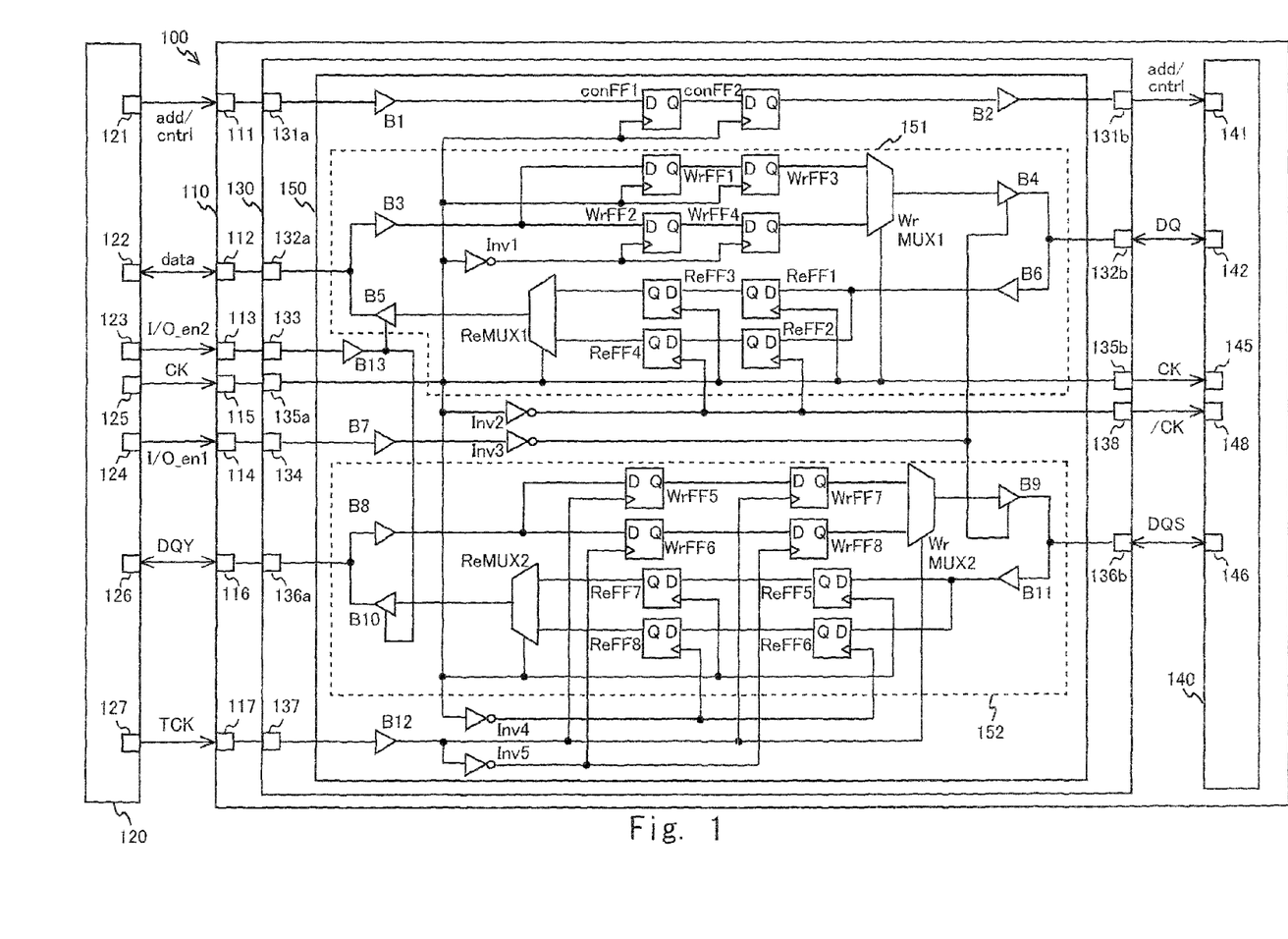
FIG. 1 is a structural diagram of a semiconductor integrated circuit device in accordance with an exemplary embodiment of the present invention.

Specific exemplary embodiments of the present invention are explained hereinafter in detail with reference to the drawings. FIG. 1 shows a structural diagram of a semiconductor integrated circuit device 100 having a SiP architecture in accordance with an exemplary embodiment of the present invention. As shown in FIG. 1, the semiconductor integrated circuit device 100 includes a first chip (e.g., logic chip) 130 having a specific function such as signal processing and a second chip (e.g., DDR memory chip) 140, both of which are mounted in a single package 110. Furthermore, the package 110 is configured so as to connect to an externally-provided external device, i.e., a tester (testing device) 120.

It is configured such that access to the DDR memory chip 140 is carried out through the logic chip 130. That is, the memory chip 140 is not directly connected to any external terminals of the package 110, and is configured such that data input/output is carried out in response to access from the logic chip 130.

The DDR memory chip 140 has a plurality of memory arrays (not shown) arranged therein, and various data is retained in the memory arrays. The DDR memory chip 140 has an input terminal 141 for address and various control signals ("add/cntrl"), an input/output terminal 142 for a data signal (DQ), an input terminal 145 for a clock signal (CK), an input terminal 148 for an inverted clock signal (/CK), and an input/output signal 146 for a data strobe signal (DQS). These input/output terminals of the DDR memory chip 140 are connected to their respective terminals 131b, 132b, 135b, 138, and 136b of the logic chip 130. Note that the data strobe signal DQS does not have a synchronous relation with the clock signal or the inverted clock signal, but does have a synchronous relation with data that is input to or output from the DDR memory chip 140. Note also that an assumption is made in the DDR memory chip 140 that the data strobe signal DQS needs to be delayed from the data input timing by around one fourth of the clock cycle of the clock signal in order to secure set-up/hold margins in write operation.

The logic chip 130 has a through circuit 150, a logic circuit (not shown), and another plurality of terminals separately from the terminals 131b, 132b, 135b, 138, and 136b within the chip. The logic chip 130 has, in addition to the above-mentioned terminals, terminals 131a, 132a, 133, 134, 135a, 136a, and 137. These terminals are connected to terminals 121-127 of the tester 120 through their respective terminals 111-117 of the package 110.

Specifically, the terminal 121 that outputs the address and various control signals ("add/cntrl") of the tester 120 is connected to the terminal 131a of the logic chip 130 through the terminal 111 of the package 110. Similarly, the input/output terminal 122 for a first test signal (e.g., test data signal "data") of the tester 120 is connected to the terminal 132a of the logic chip 130 through the terminal 112 of the package 110.

Similarly, the output terminal 123 for an I/O_en2 signal of the tester 120 is connected to the terminal 133 of the logic chip 130 through the terminal 113 of the package 110. This I/O_en2 signal is a signal to control the availability/unavailability of a bus from the DDR memory chip 140 to the tester 120 in read operation for the DDR memory chip 140. For example, the I/O_en2 signal may become a high level in read operation for the DDR memory chip 140, and thereby making the bus from the DDR memory chip 140 to the tester 120 enabled. On the other hands, the I/O_en2 signal may become a low level in write operation for the DDR memory chip 140, and thereby making the bus from the DDR memory chip 140 to the tester 120 disabled.

Similarly, the output terminal 124 for an I/O_en1 signal of the tester 120 is connected to the terminal 134 of the logic chip 130 through the terminal 114 of the package 110. This I/O_en1 signal is a signal to control the availability/unavailability of a bus from the tester 120 to the DDR memory chip 140 in write operation for the DDR memory chip 140. For example, the I/O_en1 signal may become a high level in write operation for the DDR memory chip 140, and thereby making the bus from the tester 120 to the DDR memory chip 140 enabled. On the other hands, the I/O_en1 signal may become a low level in read operation for the DDR memory chip 140, and thereby making the bus from the-tester 120 to the DDP memory chip 140 disabled.

Similarly, the output terminal 125 for a clock signal of the tester 120 is connected to the terminal 135a of the logic chip 130 through the terminal 115 of the package 110. Similarly, the input/output terminal 126 for a test signal (e.g., test strobe signal DQY) of the tester 120 is connected to the terminal 136a of the logic chip 130 through the terminal 116 of the package 110. Similarly, the output terminal 127 for a test clock signal (TCK) of the tester 120 is connected to the terminal 137 of the logic chip 130 through the terminal 117 of the package 110. Note that the test strobe signal DQY is in synchronization with neither the clock signal nor the inverted clock signal, and the tester 120 carries out the input/output of a test data signal "data" in synchronization with this test strobe signal DQY. Note also that an assumption made in an exemplary embodiment of the present invention that the test clock signal has the same clock cycle as that of the clock signal and has a waveform that is delayed from the clock signal by one fourth of the clock cycle.

The through circuit 150 is a test circuit to carries out operational verification on the DDR memory chip 140. The through circuit 150 includes flip-flops conFF1, conFF2, WrFF1-WrFF8, and ReFF1-ReFF8, multiplexers WrMUX1, WrMUX2, ReMUX1, and ReMUX2, buffers B1-B13, and inverters Inv1-Inv5.

The terminal 135a and the terminal 135b are connected to each other. Furthermore, the terminal 135a is also connected to the input terminal of the inverter Inv2, so that an inverted clock signal generated by inverting the clock signal is output from the inverter Inv2. The output terminal of this inverter Inv2 is connected to the terminal 138. In the following explanation, when a clock signal is supplied to each circuit, it is assumed that the clock signal is supplied from the terminal 135a.

The terminal 137 is connected to the input of the buffer B12, so that the test clock signal is output from the output terminal of the buffer B12. Note that the test clock signal is output in a waveform that is delayed from the clock signal by one fourth of the clock cycle. Furthermore, the output of the buffer B12 is also connected to the inverter Inv5, so that an inverted test clock signal (/TCK) generated by inverting the test clock signal is output from the inverter Inv5. In the following explanation, when a test clock signal is supplied to each circuit, it is assumed that the signal is supplied from the output of the buffer B12. Further, when an inverted test clock signal is supplied, it is assumed that the signal is supplied from the output terminal of the inverter Inv5.

The address and various control signals "add/cntrl" that are input from the terminal 121 of the tester 120 to the terminal 131a through the terminal 111 are latched in the flip-flop conFF1 through the buffer B1 at the rising timing of the clock signal. Furthermore, the signal output from the flip-flop conFF1 is latched in the flip-flop conFF2 at the next rising timing of the clock signal. The signal output from the flip-flop conFF2 is input to the buffer B2 and output to the terminal 131b.

The test data signal "data" that is input from the terminal 122 of the tester 120 to the terminal 132a through the terminal 112 is input to the flip--flops WrFF1 and WrFF2 through the buffer B3. At this point, the flip-flop WrFF1 latches the test data signal "data" at the rising timing of the clock signal, and the flip-flop WrFF2 latches the test data signal "data" at the rising timing of the inverted clock signal generated by inverting the clock signal at the inverter Inv1.

Furthermore, a signal output from the flip-flop WrFF1 is latched in the flip-flop WrFF3 at the next rising timing of the clock signal. A signal output from the flip-flop WrFF2 is latched in the flip-flop WrFF4 at the next rising timing of the above--mentioned inverted clock signal. The two signals output from the flip-flops WrFF3 and WrFF4 are input to the multiplexer WrMUX1, and either one of the two signals is output depending on the state of the clock signal. In an exemplary embodiment, the signal from the flip-flop WrFF3 is output to the buffer B4 when the clock signal is at the high level, and the signal from the flip-flop WrFF4 is output to the buffer B4 when the clock signal is at the low level.

A signal output from the multiplexer WrMUX1 is input to the buffer B4, and output to the terminal 132b as a first signal (e.g., data signal DQ). Note that the availability/unavailability of the buffer B4 is controlled by a signal supplied from the terminal 134 through the buffer B7 and the inverter Inv3. In an exemplary embodiment, when the I/O_en1 signal is at the low level, the buffer B4 is enabled and outputs the signal output from the multiplexer WrMUX1 to the terminal 132b. Furthermore, a signal output from the terminal 132b of the logic chip 130 is input to the terminal 142 of the DDR memory chip 140 as a data signal DQ.

The test strobe signal DQY that is input from the terminal 126 of the tester 120 to the terminal 136a through the terminal 116 is input to the flip-flops WrFF5 and WrFF6 through the buffer B8. At this point, the flip-flop WrFF5 latches the test strobe signal DQY at the rising timing of the test clock signal, and the flip-flop WrFF6 latches the test strobe signal DQY at the rising timing of the inverted test clock signal.

Furthermore, a signal output from the flip-flop WrFF5 is latched in the flip-flop WrFF7 at the next rising timing of the test clock signal. A signal output from the flip-flop WrFF6 is latched in the flip-flop WrFF8 at the next rising timing of the inverted test clock signal. The two signals output from the flip-flops WrFF7 and WrFF8 are input to the multiplexer WrMUX2, and either one of the two signals is output depending on the state of the test clock signal. In an exemplary embodiment, the signal from the flip-flop WrFF7 is output to the buffer B9 when the test clock signal is at the high level, and the signal from the flip-flop WrFF8 is output to the buffer B9 when the test clock signal is at the low level.

A signal output from the multiplexer WrMUX2 is input to the buffer B9, and output to the terminal 136b as a second signal (e.g., data strobe signal DQS). Note that the availability/unavailability of the buffer B9 is controlled by an I/O_en1 signal that is supplied from the terminal 134 through the buffer B7 and the inverter Inv3. In an exemplary embodiment, when the I/O_en1 signal is at the low level, the buffer B9 outputs the inputted signal to the terminal 136b. Furthermore, a signal output from the terminal 136b of the logic chip 130 is input to the terminal 146 of the DDR memory chip 140 as a data strobe signal DQS. The data signal DQ supplied to the above-mentioned terminal 142 is input to the DDR memory chip 140 in synchronization with the rising edge or the falling edge of the data strobe signal DQS input to the terminal 146.

The data signal DQ that is input from the DDR memory chip 140 to the terminal 132b is input to the flip-flops ReFF1 and ReFF2 through the buffer B6. At this point, the flip-flop ReFF1 latches the data signal DQ at the rising timing of the clock signal, and the flip-flop ReFF2 latches the data signal DQ at the rising timing of the inverted clock signal generated by inverting the clock signal at the inverter Inv2.

Furthermore, a signal output from the flip-flop ReFF1 is latched in the flip-flop ReFF3 at the next rising timing of the clock signal. A signal output from the flip-flop ReFF2 is latched in the flip-flop ReFF4 at the next rising timing of the above-mentioned inverted clock signal. The two signals output from the flip-flops ReFF3 and ReFF4 are input to the multiplexer ReMUX1, and either one of the two signals is output depending on the state of the clock signal. In an exemplary embodiment, the signal from the flip-flop ReFF3 is output to the buffer B5 when the clock signal is at the high level, and the signal from the flip-flop ReFF4 is output to the buffer B5 when the clock signal is at the low level.

A signal output from the multiplexer ReMUX1 is input to the buffer B5 and output to the terminal 132a. Note that the availability/unavailability of the buffer B5 is controlled by an I/O_en2 signal that is supplied from the terminal 133 through the buffer B13. In an exemplary embodiment, when the I/O_en2 signal is at the high level, the buffer B5 outputs the inputted signal to the terminal 132a. Furthermore, a signal output from the terminal 132a of the logic chip 130 is input to the terminal 122 of the tester 120 through the terminal 112 as a test data signal "data".

The data strobe signal DQS that is input from the DDR memory chip 140 to the terminal 136b is input to the flip-flops ReFF5 and ReFF6 through the buffer B11. At this point, the flip-flop ReFF5 latches the data strobe signal DQS at the rising timing of the clock signal, and the flip-flop ReFF6 latches the DQS signal at the rising timing of the inverted clock signal generated by inverting the clock signal at the inverter Inv4.

Furthermore, a signal output from the flip-flop ReFF5 is latched in the flip-flop ReFF7 at the next rising timing of the clock signal. A signal output from the flip-flop ReFF6 is latched in the flip-flop ReFF8 at the next rising timing of the above-mentioned inverted clock signal. The two signals output from the flip-flops ReFF7 and ReFF8 are input to the multiplexer ReMUX2, and either one of the two signals is output depending on the state of the clock signal. In an exemplary embodiment, the signal from the flip-flop ReFF7 is output to the buffer B10 when the clock signal is at the high level, and the signal from the flip-flop ReFF8 is output to the buffer B10 when the clock signal is at the low level.

A signal output from the multiplexer ReMUX2 is input to the buffer B10 and output to the terminal 136a. Note that the availability/unavailability of the buffer B10 is controlled by the I/O_en2 signal that is supplied from the terminal 133 through the buffer B13. In an exemplary embodiment, when the I/O_en2 signal is at the low level, it outputs the inputted signal to the terminal 136a. Furthermore, a signal output from the terminal 136a of the logic chip 130 is input to the terminal 126 of the tester 120 through the terminal 116 as a test strobe signal DQY. The test data signal "data" supplied to the above-mentioned terminal 122 is input to the tester 120 in synchronization with the rising edge or the falling edge of the test strobe signal DQY input to the terminal 126.

As has been explained above, the through circuit 150 has a first signal transmission path through which the first signal (data signal DQ) is generated from the first test signal (test data signal "data") and, inversely, the first test signal is generated from the first signal, and a second signal transmission path through which the second signal (data strobe signal DQS) is generated from the second test signal (test strobe signal DQY) and, inversely, the second test signal is generated from the second signal.

As shown in FIG. 1, the flip-flops WrFF1-WrFF4 and ReFF1-ReFF4, the buffers B3-B6, and the multiplexers WrMUX1 and ReMUX1 constitute a first signal transmission path 151.

Note that the flip-flops WrFF1-WrFF4 serves as flip-flops for write operation from the tester 120 to the DDR memory chip 140, and the flip-flops ReFF1-ReFF4 serves as flip-flops for read operation from the DDR memory chip 140 to the tester 120.

Furthermore, as shown in FIG. 1, the flip-flops WrFF5-WrFF8 and ReFF5-ReFF8, the buffers B8-B11, and the multiplexers WrMUX2 and ReMUX2 constitute a second signal transmission path 152.

Note that the flip-flops WrFF5-WrFF8 serves as flip-flops for write operation from the tester 120 to the DDR memory chip 140, and the flip-flops ReFF5-ReFF8 serves as flip-flops for read operation from the DDR memory chip 140 to the tester 120.

Note also that the flip-flops conFF1 and conFF2, and the buffer B1 and B2 constitute a signal transmission path for address and control signals.

Note that in the normal operation, the logic chip 130 of the semiconductor integrated circuit device 100 outputs signals that are input from the terminal 132a or the like (or terminal 132b or the like) to the terminal 132b or the like (or terminal 132a or the like) through a logic circuit (not shown) without the intervention of the above-mentioned flip-flops. On the other hand, a test is carried out on the DDR memory chip 140 directly from the tester 120 through the above-mentioned flip-flops in the test mode. The operation of the semiconductor integrated circuit device 100 in the test mode is explained hereinafter.

Figure 2:
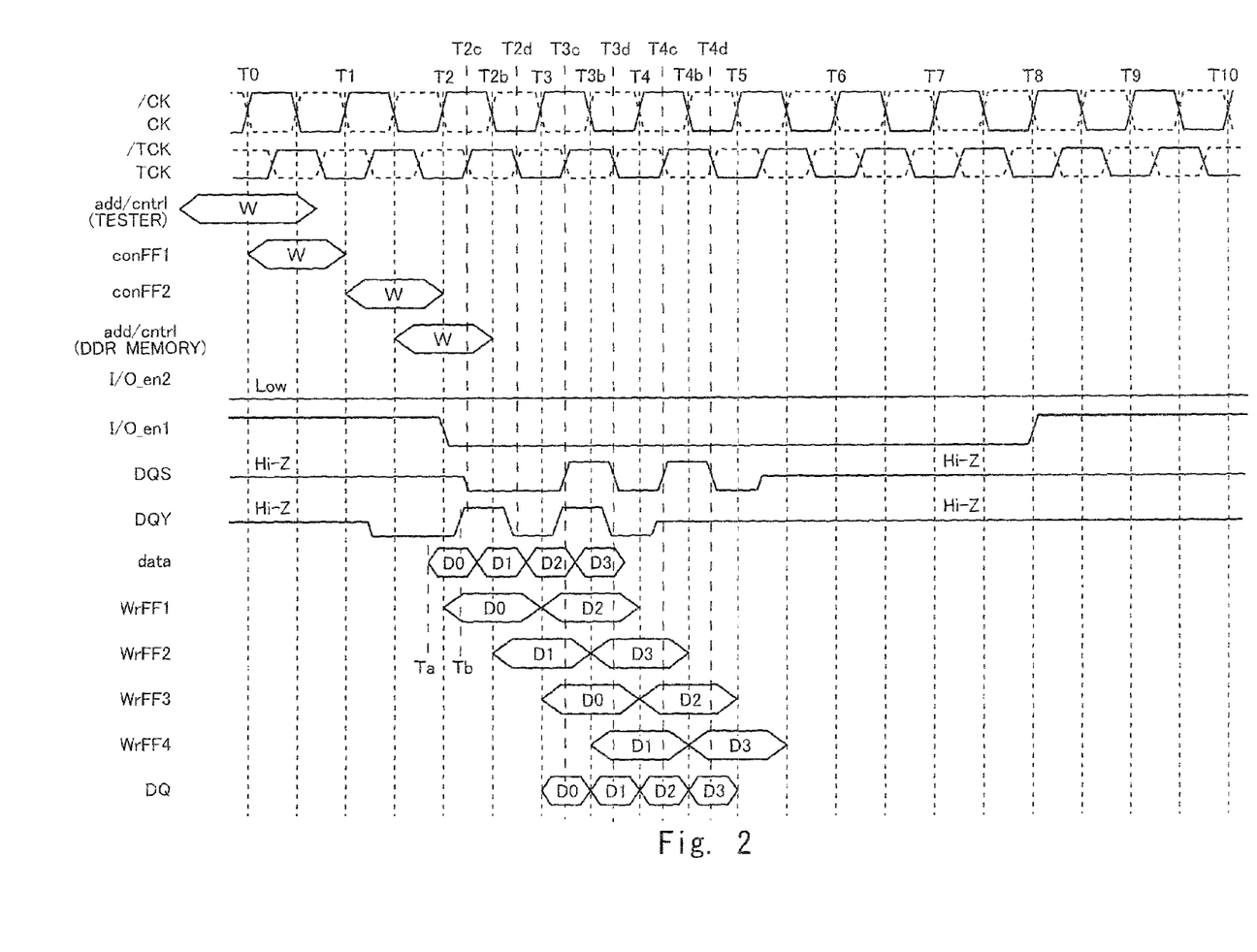
FIG. 2 is a timing chart of the semiconductor integrated circuit device in accordance with an exemplary embodiment of the present invention.

FIG. 2 shows a timing chart of a circuit having a structure shown in FIG. 1 in write operation. As shown in FIG. 2, an "add/cntrl" signal is first output from the terminal 121 of the tester 120 ("W" in the figure) At time T0, the flip-flop conFF1 of the through circuit 150 latches this signal in synchronization with the rising edge of a clock signal. At time T1, the flip-flop conFF2 latches the "add/cntrl" signal that is retained by the flip-flop conFF1 in synchronization with the rising edge of the clock signal. The "add/cntrl" signal that is retained by the flip-flop conFF2 is input to the DDR memory chip 140. As a result, the "add/cntrl" signal is synchronized to the clock signal by the flip-flops conFF1 and conFF2, and then input to the DDR memory chip 140 as explained above.

At time T2, an I/O_en1 signal at a low level is output from the tester 120 to the terminal 124. The bus lines between the buffer B4 and the terminal 132b and between the buffer B9 and the terminal 136b are released by this signal. Furthermore, at time Ta, test data signals "data" ("D0-D3" in FIG. 2) are successively output from the tester 120. Furthermore, at time Tb, a test strobe signal DQY, which rises from a low level to a high level, is output from the terminal 126. Both the test data signal and the test strobe signal DQY are not in synchronization with the clock signal. Furthermore, the test data signals D0-D3 are output at intervals of one half of the cycle of the clock signal. The interval between the rising edge and the falling edge of adjacent two pulses in the test strobe signal DQY is also one half of the cycle.

At time T2, the flip-flop WrFF1 of the through circuit 150 latches the test data signal D0 in synchronization with the rising edge of the clock signal. At time T3, the flip-flop WrFF3 latches the test data signal D0 that is retained by the flip-flop WrFF1 in synchronization with the rising edge of the clock signal. The test data signal D0 that is retained by the flip-flop WrFF3 is supplied to the terminal 132b of logic chip 130 through the multiplexer WrMUX1.

At time T2b, i.e., after one-half cycle of the clock signal from the time T2, the flip-flop WrFF2 of the through circuit 150 latches the test data signal D1 in synchronization with the rising edge of the inverted clock signal. At time T3b, i.e., after one-half cycle of the clock signal from the time T3, the flip-flop WrFF4 latches the test data signal that is retained by the flip-flop WrFF2 in synchronization with the rising edge of the inverted clock signal. The test data signal that is retained by the flip-flop WrFF4 is supplied to the terminal 132b of logic chip 130 through the multiplexer WrMUX1. Note that the multiplexer WrMUX1 supplies the test data signal from the flip-flop WrFF3 to the terminal 132b of the logic chip 130 when the clock signal is at the high level, and supplies the test data signal from the flip-flop WrFF4 to the terminal 132b of the logic chip 130 when the clock signal is at the low level.

Furthermore, the test data signal D2 is latched in the flip-flop WrFF1 of the through circuit 150 in synchronization with the rising edge of the clock signal at time T3. However, since the subsequent actions are similar to those of the test data signal D0, the explanation of them is omitted. Furthermore, the test data signal D3 is latched in the flip-flop WrFF2 of the through circuit 150 in synchronization with the rising edge of the inverted clock signal at time T3b. However, since the subsequent actions are similar to those of the test data signal D1, the explanation of them is omitted. As a result, the test data signals D0-D3 from the tester 120 are synchronized to the clock signal by the flip-flops WrFF1-WrFF4, and then input to the terminal 132b of the logic chip 130 as explained above.

With regard to the test strobe signal DQY, at time T2c, i.e., after one-fourth cycle of the clock signal from the time T2, the flip-flop WrFF5 of the through circuit 150 latches the test strobe signal DQY, which is at the high level at that point, in synchronization with the rising edge of the test clock signal. At time T3c, i.e., after one-fourth cycle of the clock signal from the time T3, the flip-flop WrFF7 latches the signal that is retained by the flip-flop WrFF5 in synchronization with the rising edge of the test clock signal. The signal that is retained by the flip-flop WrFF7 is supplied to the terminal 136b of logic chip 130 through the multiplexer WrMUX2.

Furthermore, at time T2d, i.e., after one-fourth cycle of the clock signal from the time T2b, the flip-flop WrFF6 of the through circuit 150 latches the test strobe signal DQY, which is at the low level at that point, in synchronization with the rising edge of the inverted test clock signal. At time T3d, i.e., after one-fourth cycle of the clock signal from the time T3b, the flip-flop WrFF8 latches the signal that is retained by the flip-flop WrFF6 in synchronization with the rising edge of the inverted test clock signal. The signal that is retained by the flip-flop WrFF8 is supplied to the terminal 136b of logic chip 130 through the multiplexer WrMUX2. Note that the multiplexer WrMUX2 supplies the data signal from the flip-flop WrFF7 to-the terminal 136b of the logic chip 130 when the test clock signal is at the high level, and supplies the data signal from the flip-flop WrFF8 to the terminal 136b of the logic chip 130 when the test clock signal is at the low level.

Furthermore, the test strobe signal DQY is also latched at the high level in the flip-flop WrFF5 of the through circuit 150 in synchronization with the rising edge of the test clock signal at time T3c. However, since the subsequent actions are similar to those in the above-described case where the test strobe signal DQY is at the high level, the explanation of them is omitted. Furthermore, the test strobe signal DQY is also latched at the low level in the flip-flop WrFF6 of the through circuit 150 in synchronization with the rising edge of the test clock signal at time T3d. However, since the subsequent actions are similar to those in the above-described case where the test strobe signal DQY is at the low level, the explanation of them is omitted. As a result, the test strobe signal DQY from the tester 120 is synchronized to the test clock signal by the flip-flops WrFF5-WrFF8, and then input to the terminal 136b of the logic chip 130 as explained above.

As stated above, a signal from the terminal 132b is supplied to the terminal 142 as a data signal DQ, and a signal from the terminal 136b is supplied to the terminal 146 as a data strobe signal DQS. Therefore, the data signals D0-D3 supplied to the terminal 142 are input to the DDR memory chip 140 in synchronization with the rising edge or the falling edge of the data strobe signal DQS.

As has been explained above, the test clock signal is delayed from the clock signal that is used for the flip-flops WrFF1-WrFF4 for the test data signal in write operation to the DDR memory chip 140 by a predefined time period, e.g., one fourth of the clock cycle, and the flip-flops WrFF5-WrFF8 for the test strobe signal is operated by using this delayed test clock signal in an exemplary embodiment of the present invention. Therefore, the data strobe signal DQS that is in synchronization with the test clock signal is input to the DDR memory chip 140. The data signal DQ that is in synchronization with the clock signal is also input to the DDR memory chip 140. However, since the data strobe signal DQS is input to the DDR memory chip 140 with a delay of one-fourth cycle, the problem in the related art that it is very difficult to secure set-up/hold margins can be solved.

Figure 3:
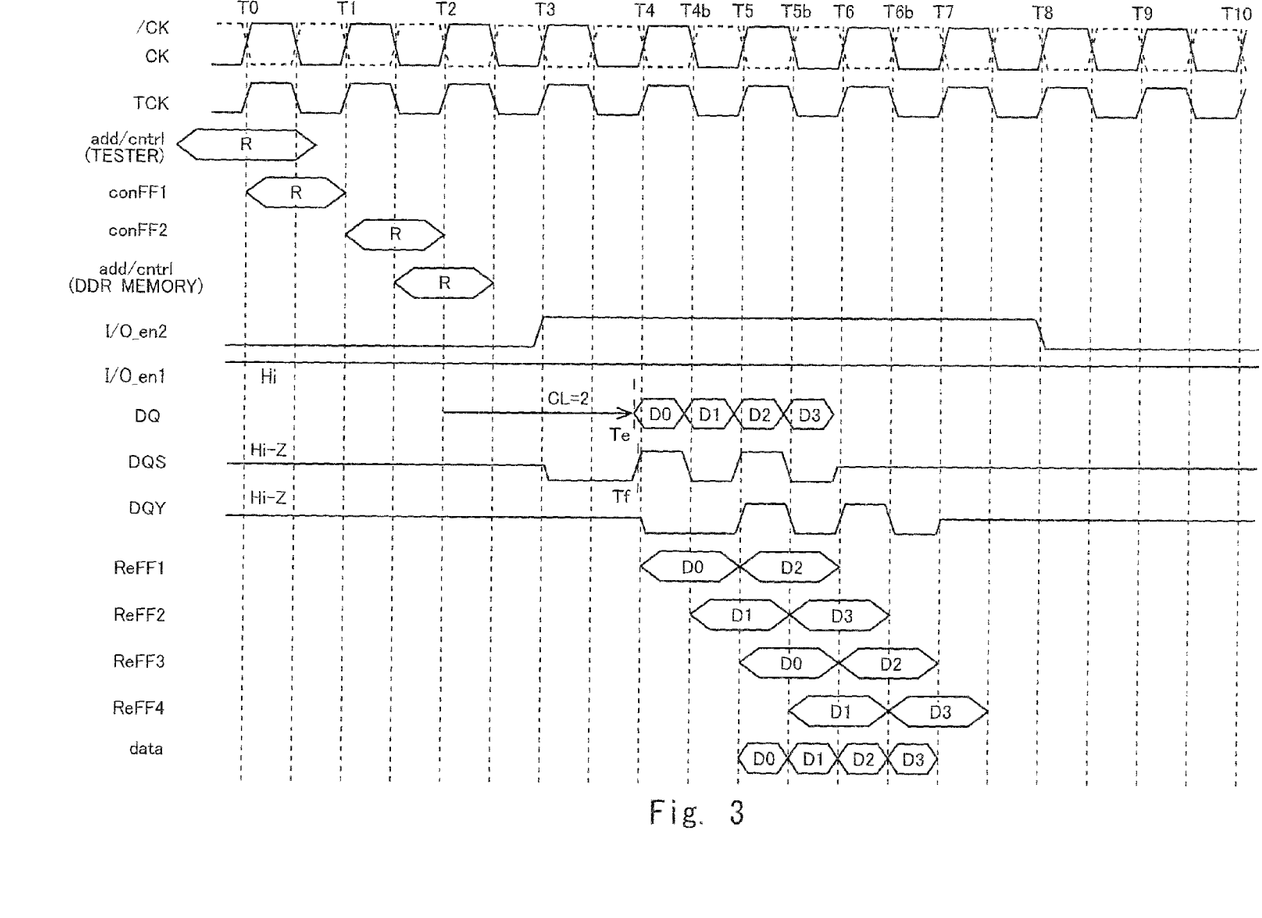
FIG. 3 is a timing chart of the semiconductor integrated circuit device in accordance with an exemplary embodiment of the present invention.

FIG. 3 shows a timing chart of a circuit having a structure shown in FIG. 1 in read operation. As shown in FIG. 3, address and various control signals "add/cntrl" are output from the terminal 121 of the tester 120 ("R" in FIG. 3) At time T0, the flip-flop conFF1 of the through circuit 150 latches this signal in synchronization with the rising edge of a clock signal. At time T1, the flip-flop conFF2 latches the data signal that is retained by the flip-flop conFF1 in synchronization with the rising edge of the clock signal. The data signal that is retained by the flip-flop conFF2 is input to the DDR memory chip 140. As a result, the address and various control signals "add/cntrl" are synchronized to the clock signal by the flip-flops conFF1 and conFF2, and then input to the DDR memory chip 140 as explained above.

At time T3, an I/O_en2 signal at a high level is output from the tester 120 to the terminal 123. The bus lines between the buffer B5 and the terminal 132a and between the buffer B10 and the terminal 136a are released by this signal.

At time Te, data signals DQ ("D0-D3" in FIG. 3) are successively output from the DDR memory chip 140. At this point, an assumption is made that the CAS (Column Address Strobe Latency) of the DDR memory chip 140 is two. Furthermore, at time Tf, a data strobe signal DQS, which rises from a low level to a high level, is output from the terminal 146. Both the data signal and the data strobe signal DQS are not in synchronization with the clock signal. Furthermore, the data signals D0-D3 are output at intervals of one half of the cycle of the clock signal. The interval between the rising edge and the falling edge of adjacent two pulses in the data strobe signal DQS is also one half of the cycle.

At time T4, the flip-flop ReFF1 of the through circuit 150 latches the data signal D0 in synchronization with the rising edge of the clock signal. At time T5, the flip-flop ReFF3 latches the data signal D0 that is retained by the flip-flop ReFF1 in synchronization with the rising edge of the clock signal. The data signal D0 that is retained by the flip-flop ReFF3 is supplied to the terminal 132a of logic chip 130 through the multiplexer ReMUX1.

At time T4b, i.e., after one-half cycle of the clock signal from the time T4, the flip-flop ReFF2 of the through circuit 150 latches the data signal D1 in synchronization with the rising edge of the inverted clock signal. At time T5b, i.e., after one-half cycle of the clock signal from the time T5, the flip-flop ReFF4 latches the signal that is retained by the flip-flop ReFF2 in synchronization with the rising edge of the inverted clock signal. The signal that is retained by the flip-flop ReFF4 is supplied to the terminal 132a of logic chip 130 through the multiplexer ReMUX1. Note that the multiplexer ReMUX1 supplies the signal from the flip-flop ReFF3 to the terminal 132a of the logic chip 130 when the clock signal is at the high level, and supplies the signal from the flip-flop ReFF4 to the terminal 132a of the logic chip 130 when the clock signal is at the low level.

Furthermore, the data signal D2 is latched in the flip-flop ReFF1 of the through circuit 150 in synchronization with the rising edge of the clock signal at time T5. However, since the subsequent actions are similar to those of the data signal D0, the explanation of them is omitted. Furthermore, the data signal D3 is latched in the flip-flop ReFF2 of the through circuit 150 in synchronization with the rising edge of the inverted clock signal at time T5b. However, since the subsequent actions are similar to those of the data signal D1, the explanation of them is omitted. As a result, the data signals D0-D3 from the DDR memory chip 140 are synchronized to the clock signal by the flip-flops ReFF1-ReFF4, and then input to the terminal 132a of the logic chip 130 as explained above.

With regard to the data strobe signal DQS, at time T4, the flip-flop ReFF5 of the through circuit 150 latches the data strobe signal DQS, which is at the high level at that point, in synchronization with the rising edge of the clock signal. At time T5, the flip-flop ReFF7 latches the signal that is retained by the flip-flop ReFF5 in synchronization with the rising edge of the clock signal. The signal that is retained by the flip-flop ReFF7 is supplied to the terminal 136a of logic chip 130 through the multiplexer ReMUX2.

Furthermore, at time T4b, i.e., after one-half cycle of the clock signal from the time T4, the flip-flop ReFF6 of the through circuit 150 latches the data strobe signal DQS, which is at the low level at that point, in synchronization with the rising edge of the inverted clock signal. At time T5b, i.e., after one-half cycle of the clock signal from the time T5, the flip-flop ReFF8 latches the signal that is retained by the flip-flop ReFF6 in synchronization with the rising edge of the inverted clock signal. The signal that is retained by the flip-flop ReFF8 is supplied to the terminal 136a of logic chip 130 through the multiplexer ReMUX2. Note that the multiplexer ReMUX2 supplies the data signal from the flip-flop ReEF7 to the terminal 136a of the logic chip 130 when the clock signal is at the high level, and supplies the data signal from the flip-flop ReFF8 to the terminal 136a of the logic chip 130 when the clock signal is at the low level.

Furthermore, the data strobe signal DQS is also latched at the high level in the flip-flop ReFF5 of the through circuit 150 in synchronization with the rising edge of the clock signal at time T5. However, since the subsequent actions are similar to those in the above-described case where the data strobe signal DQS is at the high level, the explanation of them is omitted. Furthermore, the data strobe signal DQS is also latched at the low level in the flip-flop ReFF6 of the through circuit 150 in synchronization with the rising edge of the inverted clock signal at time T5b. However, since the subsequent actions are similar to those in the above-described case where the data strobe signal DQS is at the low level, the explanation of them is omitted. As a result, the data strobe signal DQS from the DDR memory chip 140 is synchronized to the clock signal by the flip-flops ReFF5-ReFF8, and then input to the terminal 136a of the logic chip 130 as explained above.

As described above, a signal from the terminal 132a of the logic chip 130 is supplied to the terminal 122 of the tester 120 through the terminal 112 of the package 110 as a test data signal "data". Furthermore, a signal from the terminal 136a of the logic chip 130 is supplied to the terminal 126 through the terminal 116 of the package 110 as a test strobe signal DQY. Therefore, the test data signals D0-D3 supplied to the terminal 122 of the tester 120 are input to the tester 120 in synchronization with the rising edge or the falling edge of the test strobe signal DQY.

As described above, the flip-flops ReFF1-ReFF4 used for the data signal in read operation of the DDR memory chip 140 and the flip-flops ReFF5-ReFF8 used for the data strobe signal DQS are operated in synchronization with the clock signal in an exemplary embodiment of the present invention. In contrast to the write operation explained with reference to FIG. 2, the test clock signal is not used and the flip-flops ReFF1-ReFF8 are operated in synchronization with the clock signal. Note that the test clock signal may be output in synchronization with the clock signal in the read operation of the DDR memory chip 140.

Second Exemplary Embodiment

Figure 4:
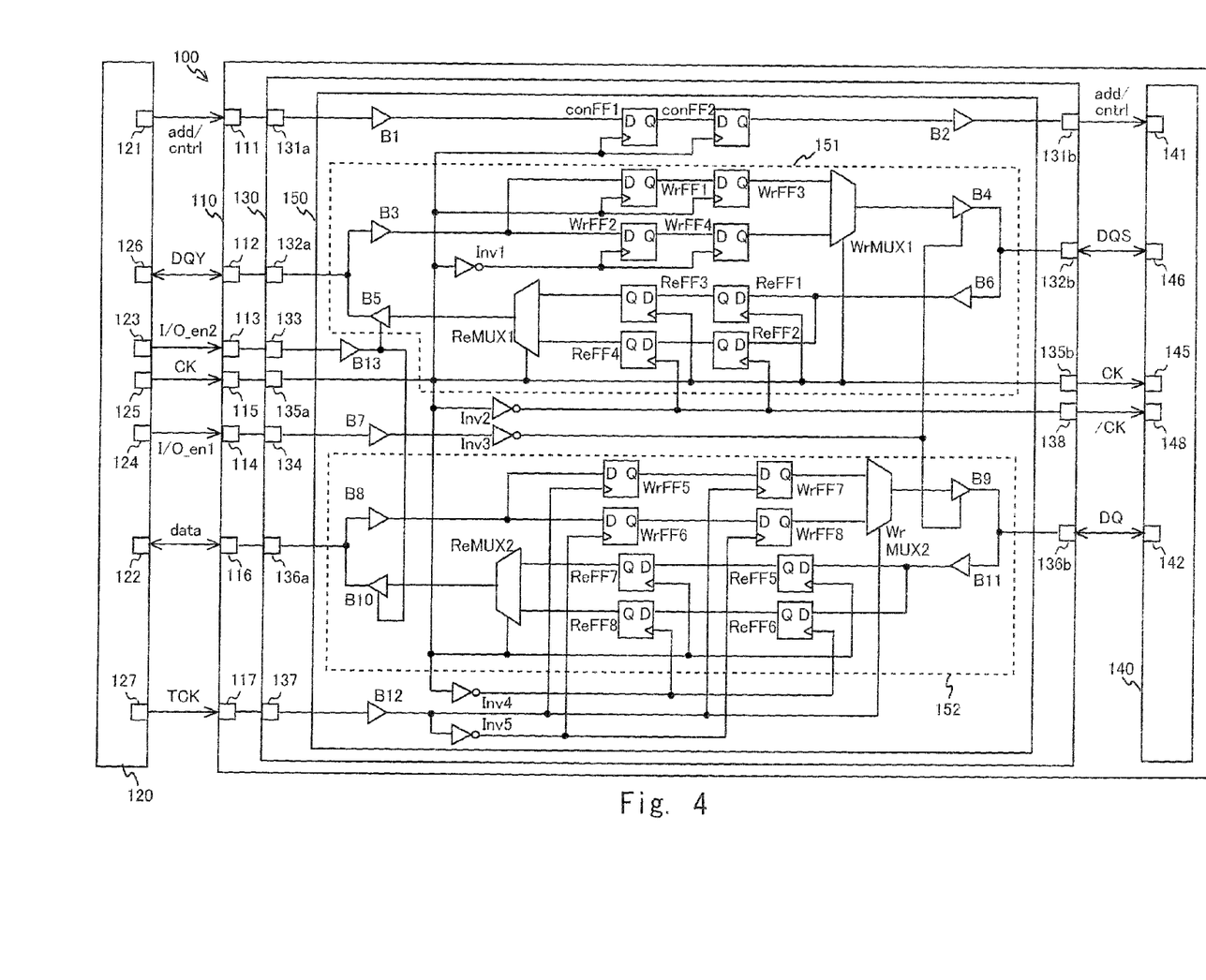
FIG. 4 is a structural diagram of a semiconductor integrated circuit device in accordance with another exemplary embodiment of the present invention.
Figure 5:
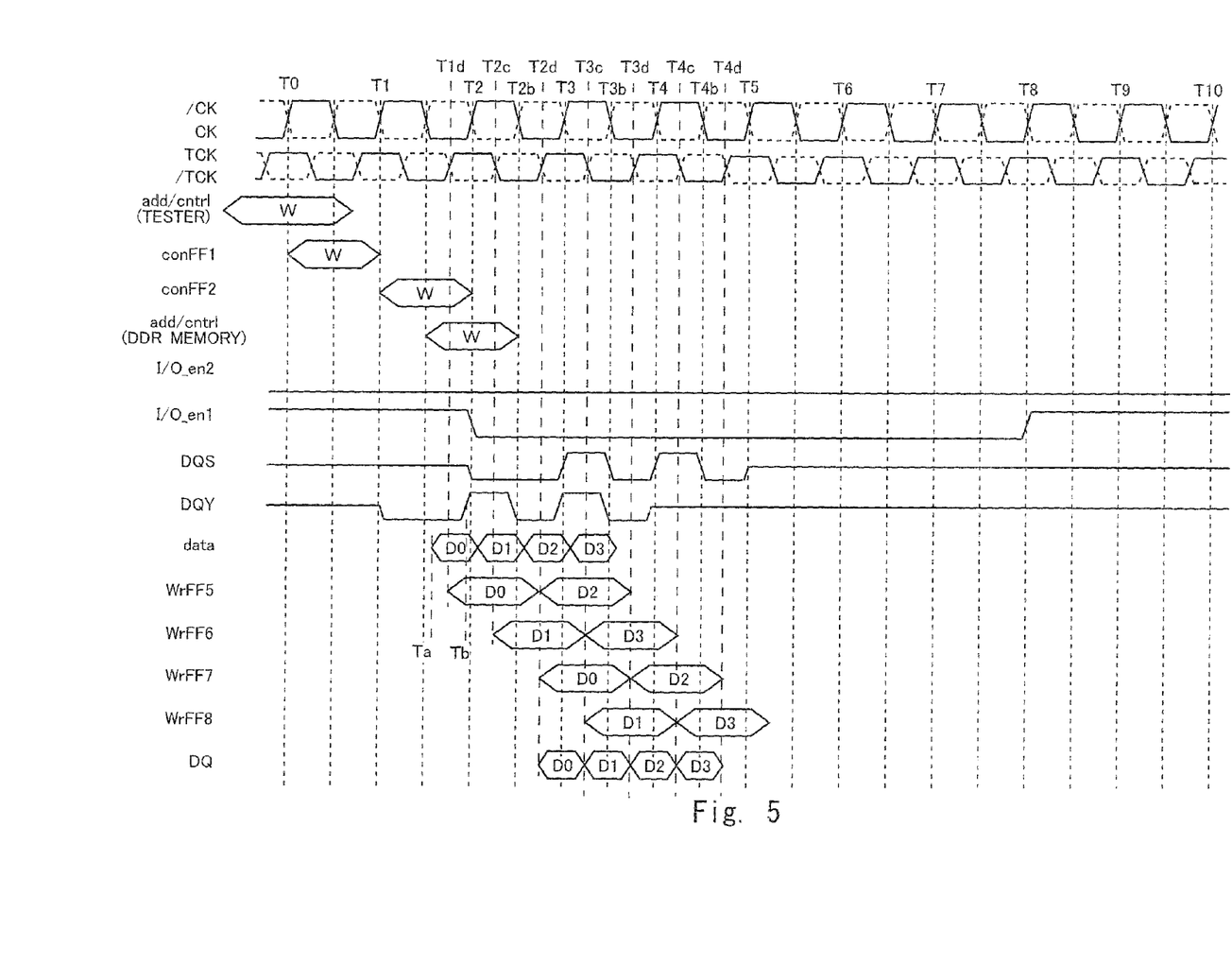
FIG. 5 is a timing chart of the semiconductor integrated circuit device in accordance with another exemplary embodiment of the present invention.
Figure 6:
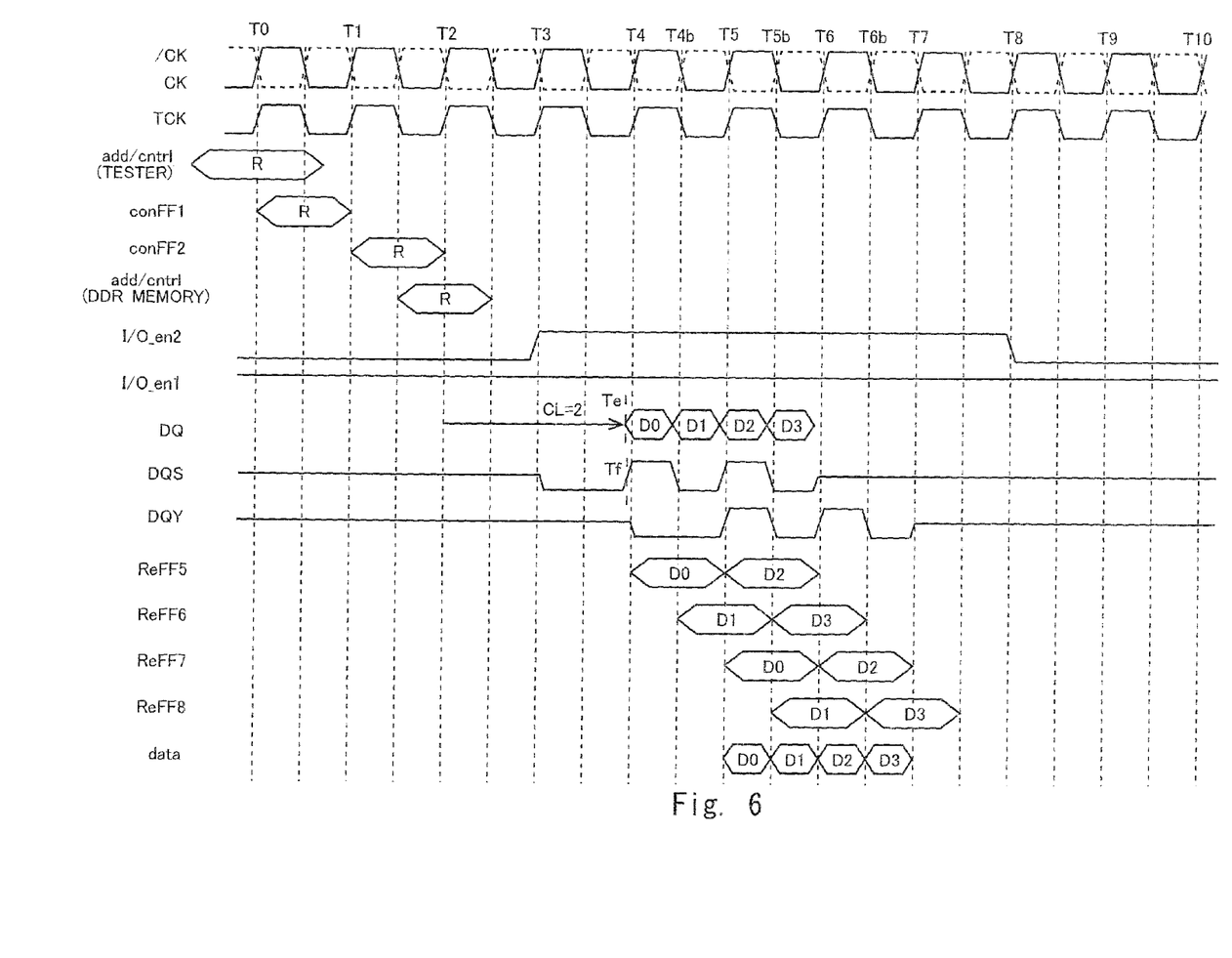
FIG. 6 is a timing chart of the semiconductor integrated circuit device in accordance with another exemplary embodiment of the present invention.

A semiconductor integrated circuit device 100 in accordance with another exemplary embodiment of the present invention transmits and receives a test strobe signal DQY through a first signal transmission path, and transmits and receives a test data signal "data" through a second signal transmission path Furthermore, the phase relation between the clock signal and the test clock signal is also changed as the path is changed in this exemplary embodiment of the present invention. Therefore, a block diagram of a semiconductor integrated circuit device 100 in accordance with this exemplary embodiment of the present invention shown in FIG. 4 is different from the block diagram of the semiconductor integrated circuit device 100 shown in FIG. 1 in that the input/output terminals for the test strobe signal DQY and the test data signal "data" are replaced with each other. Furthermore, FIG. 5 shows a timing chart of write operation in this exemplary embodiment. The operation shown in FIG. 5 is substantially the same as the operation shown in FIG. 2 except that the test clock signal is advanced with respect to the clock signal by one fourth of the clock cycle (and with respect to the test clock signal of the previous exemplary embodiment by one half of the clock cycle). Furthermore, FIG. 6 shows a timing chart of read operation in this exemplary embodiment. Since the flip-flops involved in the read operation are also operated in synchronization with the clock signal in this exemplary embodiment, the operation shown in FIG. 6 is substantially the same as the operation shown in FIG. 3.

That is, in a semiconductor integrated circuit device 100 in accordance with one aspect of the present invention, the only requirement for the structure capable of achieving the advantageous effect that enables a test using high-speed data signals is that the test clock signal should be input through a separate path from a path for the clock signal in write operation so that set-up/hold margins of the data signal DQ and the data strobe signal DQS can be established as desired.

Note that the present invention is not limited to the above-described exemplary embodiments, and various modifications can be made without departing from the spirit of the present invention. For example, although two chips are constructed in a single package in the above-described exemplary embodiments, it is possible to consider the circuits of these two chips as circuit units on a single chip. That is, both a logic circuit having a through circuit and a DDR memory circuit may be constructed in a single chip.

The first and second exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A semiconductor integrated circuit device comprising:
a first chip that is directly accessible from outside;
a second chip that transmits and receives data to and from the first chip, the second chip being not directly accessible from outside; and
a through circuit that is provided in the first chip and transmits a first test signal and a second test signal to the second chip, the first and second test signals being input from an external device;
wherein the through circuit comprises:
a first signal transmission path to generate a first signal by synchronizing the first test signal to a clock signal input from the external device and to output the first signal to the second chip; and
a second signal transmission path to generate a second signal generated by synchronizing the second test signal to a test clock signal input from the external device and to output the second signal to the second chip.

2. The semiconductor integrated circuit device according to claim 1, wherein the first signal is a data signal for the second chip, and the second signal is a strobe signal used as a synchronous clock for the data signal.

3. The semiconductor integrated circuit device according to claim 2, wherein the test clock signal has the same clock cycle as the clock signal and a predefined delay from the clock signal.

4. The semiconductor integrated circuit device according to claim 1, wherein the first signal is a strobe signal for the second chip, and the second signal is a data signal in synchronization with the strobe signal.

5. The semiconductor integrated circuit device according to claim 4, wherein the clock signal has the same clock cycle as the test clock signal and a predefined delay from the test clock signal.

6. The semiconductor integrated circuit device according to claim 1, wherein the first chip is a logic chip having a function circuit thereon, and the second chip is a DDR memory.

7. The semiconductor integrated circuit device according to claim 6, wherein:
the logic chip comprises an external interface terminal; and
the DDR memory comprises an interface terminal to the logic chip;
wherein the DDR memory comprises:
a data input/output terminal; and
a strobe terminal to input or output a strobe signal for a data signal, the data signal being input or output through the data input/output terminal; and
wherein the logic chip comprise a control circuit to control input/output timing of the strobe terminal.

8. The semiconductor integrated circuit device according to claim 7, wherein the control circuit:
outputs the data signal to the data input/output terminal in synchronization with a first clock input from an external device; and
controls the input/output timing of the strobe terminal in synchronization with a second clock signal input from the external device.

9. The semiconductor integrated circuit device according to claim 8, wherein the second clock signal has a predefined delay from the first clock signal.

10. The semiconductor integrated circuit device according to claim 8, wherein the first clock signal has a predefined delay from the second clock signal.

11. A method of testing a semiconductor integrated circuit device comprising a first chip and a second chip in a single package, the first chip being directly accessible from outside and the second chip being accessed from outside through the first chip, the method comprising:
synchronizing a first test signal supplied from an external device to a clock signal supplied from the external device;
supplying the synchronized first test signal to the second chip as a first signal;
synchronizing a second test signal supplied from the external device to a test clock signal supplied from the external device; and
supplying the synchronized second test signal to the second chip as a second signal.

12. The method of testing a semiconductor integrated circuit device according to claim 11, wherein the first signal is a data signal for the second chip, and the second signal is a strobe signal used as a synchronous clock for the data signal.

13. The method of testing a semiconductor integrated circuit device according to claim 12, wherein the test clock signal has the same clock cycle as the clock signal and a predefined delay from the clock signal.

14. The method of testing a semiconductor integrated circuit device according to claim 11, wherein the first signal is a strobe signal for the second chip, and the second signal is a data signal in synchronization with the strobe signal.

15. The method of testing a semiconductor integrated circuit device according to claim 14, wherein the clock signal has the same clock cycle as the test clock signal and a predefined delay from the test clock signal.

16. The method of testing a semiconductor integrated circuit device according to claim 11, wherein the first chip is a logic chip having a function circuit thereon, and the second chip is a DDR memory.

* * * * *